United States Patent
Bright et al.

(10) Patent No.: US 7,807,070 B2
(45) Date of Patent: Oct. 5, 2010

(54) FORMULATION AND METHOD FOR DEPOSITING A MATERIAL ON A SUBSTRATE

(75) Inventors: Christopher J. Bright, Cambridge (GB); Julian Carter, Cambridgeshire (GB); Martin Cacheiro, Ames (ES); Peter Lyon, Cambridgeshire (GB)

(73) Assignee: Cambridge Display Technology Limited, Cambridgeshire (GB)

( * ) Notice: Subject to any disclaimer, the term of this patent is extended or adjusted under 35 U.S.C. 154(b) by 0 days.

(21) Appl. No.: 12/248,858

(22) Filed: Oct. 9, 2008

(65) Prior Publication Data

US 2009/0041928 A1 Feb. 12, 2009

Related U.S. Application Data

(63) Continuation of application No. 10/469,443, filed as application No. PCT/GB02/00845 on Feb. 27, 2002, now abandoned.

(60) Provisional application No. 60/291,684, filed on May 17, 2001.

(30) Foreign Application Priority Data

| Feb. 27, 2001 | (TW) | ............................... 90104585 A |
| Feb. 28, 2001 | (GB) | ................................. 0104875.0 |
| Mar. 28, 2001 | (GB) | ................................. 0107740.3 |

(51) Int. Cl.
*G06F 1/00* (2006.01)

(52) U.S. Cl. .................... 252/301.16; 106/311; 427/66; 427/256; 428/690; 428/917

(58) Field of Classification Search ............ 252/301.16; 106/311, 31.58, 31.57, 31.85; 427/66, 256; 523/160, 161; 347/95, 100; 428/690, 917
See application file for complete search history.

(56) References Cited

U.S. PATENT DOCUMENTS

| 4,080,414 A | | 3/1978 | Anderson et al. ............. 264/41 |
| 5,091,004 A | * | 2/1992 | Tabayashi et al. ........ 106/31.57 |
| 6,878,312 B1 | | 4/2005 | Kanbe et al. ................. 252/583 |

FOREIGN PATENT DOCUMENTS

| EP | 686 662 A2 | | 12/1995 |
| EP | 880 303 A1 | | 11/1998 |
| EP | 1 083 775 A1 | | 3/2001 |
| EP | 1083775 | * | 3/2001 |
| WO | WO 99/12398 | | 3/1999 |
| WO | WO 99/29789 | | 6/1999 |
| WO | WO 99/54385 | | 10/1999 |
| WO | WO 00/59267 | | 10/2000 |
| WO | WO 01/70506 | * | 9/2001 |
| WO | WO 02/18513 | | 3/2002 |

* cited by examiner

*Primary Examiner*—C. Melissa Koslow
(74) *Attorney, Agent, or Firm*—Marshall, Gerstein & Borun LLP

(57) ABSTRACT

A formulation for depositing a material on a substrate, the formulation comprising the material to be deposited on the substrate dissolved in a solvent system comprising a first solvent component having a relatively high boiling point and which exhibits a relatively low solubility with respect to the material to be deposited, and a second solvent component having a relatively low boiling point and which exhibits a relatively high solubility with respect to the material to be deposited.

9 Claims, 4 Drawing Sheets

FORMULATION AND METHOD FOR DEPOSITING A MATERIAL ON A SUBSTRATE

CROSS-REFERENCE TO RELATED APPLICATIONS

This is a continuation of U.S. patent application Ser. No. 10/469,443, filed Jan. 5, 2004 (now abandoned), which is the U.S. national phase of International Application No. PCT/GB02/00845 filed Feb. 27, 2002, and which claims the priority benefit under 35 U.S.C. §119(e) of U.S. Provisional Application Ser. No. 60/291,684 filed May 17, 2001, the entire disclosures of which are incorporated herein by reference.

BACKGROUND

1. Field of the Invention

The present invention relates to a formulation for depositing a material on a substrate, to a method of depositing a material on a substrate particularly by an ink-jet deposition technique, and to a method of producing a light-emitting device by such a deposition method.

2. Related Technology

As shown schematically in FIG. 1, a light-emitting device typically comprises a layer of an electroluminescent polymer 3 sandwiched between a cathode 2 and an anode 1 such that charge carriers can move between the electrodes and the layer of electroluminescent polymer. It is typically produced by depositing a layer of electroluminescent polymer 3 on a glass substrate 5 coated with an anode layer 1 such as a layer of indium-tin oxide (ITO) and depositing a cathode layer 2 such as a calcium layer over the layer of electroluminescent polymer 3. The device may comprise further layers, such as a hole transport layer 4 (such as a layer of doped polyethylene dioxythiophene as described in EP0686662) provided between the anode 1 and the electroluminescent polymer layer 3 and an electron transport layer provided between the cathode and the electroluminescent layer (not provided in the device shown in FIG. 1).

An ink-jet technique may be used for depositing the layer of electroluminescent polymer. Such a technique is described in EP0880303A1, whose content is incorporated herein by reference. This technique basically involves the controlled deposition of drops of a solution of the electroluminescent polymer through a nozzle followed by evaporation of the solvent. This technique is particularly suited to the deposition of patterned layers of the electroluminescent polymer. For example, in some applications, it may be required to have a layer of electroluminescent polymer comprising an ordered array of pixels, wherein each pixel is produced by the deposition of a single drop of solution of the electroluminescent polymer. It is desirable in such cases that the polymer is distributed uniformly in the spot remaining after evaporation of the solvent.

Solutions of the electroluminescent polymer in solvents such as isodurene have conventionally been used in this technique. However, there has been noticed the problem with conventional solvents that after a drop of the deposited solution has dried most of the electroluminescent polymer is deposited as a ring around the edge of the remaining spot leaving only a very thin film of the polymer at the centre of the spot. This can result in relatively poor device efficiency.

It is an aim of the present invention to provide a formulation with which a film of the desired thickness profile can be deposited on a substrate according to a technique involving controlled drop deposition.

DESCRIPTION

According to a first aspect of the present invention, there is provided a formulation for depositing a material on a substrate, the formulation comprising the material to be deposited on the substrate dissolved in a solvent system comprising a first solvent component having a relatively high boiling point and which exhibits a relatively low solubility with respect to the material to be deposited, and a second solvent component having a relatively low boiling point and which exhibits a relatively high solubility with respect to the material to be deposited.

References to the solubility of each solvent component with respect to the material are references to the solubility of the material in each solvent component.

Ink-jet techniques typically require formulations having a viscosity of up to about 20 cps. A typical viscosity for an ink jet formulation is about 10 cps.

The first solvent component may comprise one or more solvents that have a relatively high boiling point and exhibit a relatively low solubility with respect to the material to be deposited (in relation to the second solvent component), and the second solvent component may likewise comprise one or more solvents that have a relatively low boiling point and exhibit a relatively high solubility with respect to the material to be deposited (in relation to the first solvent component).

In one embodiment, the second solvent component has a boiling point in the range of 100 to 200° C. and the first solvent component has a boiling point in the range of 130 to 300° C. The difference in boiling point between the first and second solvent components is preferably in the range of 30 to 250° C., further preferably in the range of 70 to 150° C. The solubility of the material to be deposited in the first solvent component is preferably up to 0.5% weight per volume, further preferably in the range of 0.03 to 0.3% weight per volume, and the solubility of the material to be deposited in the second solvent is preferably greater than 0.5% weight per volume, further preferably greater than 1.5% weight per volume.

The proportion of the first solvent component should preferably be selected such that upon removal of the second solvent component the remaining solution of the material in the first solvent component would be substantially at or above saturation. In one embodiment, the proportion of the first solvent component is in the range of 10 to 60 volume percent, further preferably 20 to 50 volume percent.

In one embodiment, the proportion of the second solvent component is in the range of 40 to 90 volume percent, preferably 50 to 80 volume percent.

According to another aspect of the invention, there is provided a method of depositing a material on a substrate comprising depositing one or more drops of a solution of the material onto the substrate through a nozzle according to an ink-jet technique and drying each deposited drop, wherein the solution of the material comprises a formulation as described above.

The solvent system is selected such that the material begins to precipitate at a relatively early stage in the drying of the drop, i.e. such that precipitation occurs whilst a substantial amount of solvent remains unevaporated.

The solvent system is selected such that the variation in thickness of the dried drop of material on the substrate is less than 80% of the maximum thickness, preferably less than 50%, and further preferably less than 30%. It is most preferred that the thickness variation is less than 15%.

In one embodiment, the solvent system is selected such that in a formulation having 0.5% w/v of the material to be deposited, the dried drop has a thickness at its centre (i.e. the region enclosed by the ring of increased thickness, if present) of 60 to 140 nm, preferably about 70 nm to 100 nm, which is desirable for EL efficiency and lifetime of an organic light-emitting device.

In the above, the material for deposition on the substrate may, for example, be an organic material such as a polymer or a blend of polymers. In one application, it comprises one or more semiconducting conjugated polymers such as a charge transport polymer or a light-emissive polymer, or a blend of the two.

According to yet another aspect of the present invention, there is provided a method of producing a light-emitting device comprising a layer of an electroluminescent material sandwiched between two electrodes such that charge carriers can move between the electrodes and the layer of electroluminescent material, wherein the layer of electroluminescent material is produced by a method as described above.

According to another aspect of the present invention, there is provided a use of a formulation as described above for reducing or avoiding a ring deposition effect.

In a further aspect, the formulation excludes 1% w/v of a triblend containing approximately 14 wt. % of a ternary polymer containing 9,9-dioctylfluorene (F8) units (shown in FIG. 6A), benzothiadiazole (BT) units (shown in FIG. 6B) and triarylene units (shown in FIG. 6C), 56 wt. % of F8BT (shown in FIG. 6D) and 30 wt. % TFB (shown in FIG. 6E) in a solvent mixture containing 20 vol. % 1, 2, 4-trimethylbenzene and 80 vol. % xylene or a solvent mixture containing 50 vol. % 1, 2, 4-trimethylbenzene and 50 vol. % xylene.

BRIEF DESCRIPTION OF THE DRAWINGS

Embodiments of the present invention shall be described hereunder, by way of example only, with reference to the accompanying drawings in which.

EXAMPLE 1

Figure 1:
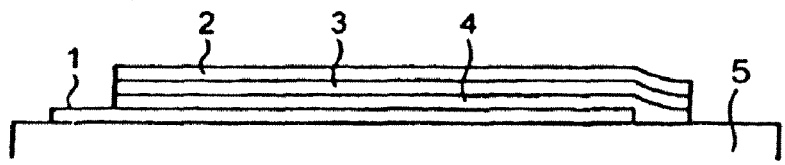
FIG. 1 is a schematic view of a light-emissive device.
Figure 2:
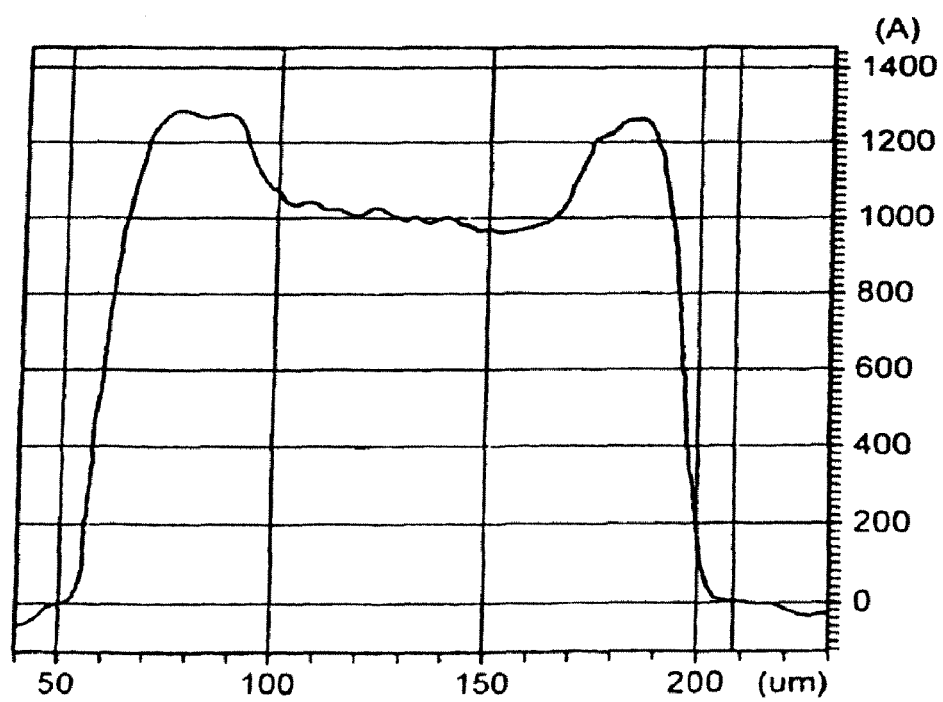
FIGS. 2 and 3 are graphs showing the thickness profile for a spot obtained by an ink-jet technique using a formulation according to embodiments of the present invention.

A solvent blend was prepared from 60 vol. % 1,2-dimethylbenzene (b.p.: 144.4° C.) and 40 vol. % α-tetralone (b.p.: 255° C.). A 0.5% w/v solution of an alternating polymer of 9,9-dioctylfluorene units and benzothiadiazole units (F8BT) having a peak molecular weight of about 266,000 was prepared using this solvent blend. Drops of this solution were deposited by an ink-jet method on the surface of a polyimide substrate that had been modified to lower its surface energy. The drops were allowed to dry at room temperature and humidity (20° C.±1.0° C. and 30-40% R.H.), and Dektak measurements of the profile of the dried drops were taken. The results of the measurements are shown in FIG. 2.

EXAMPLE 2

A solvent blend was prepared from 60 vol. % 1,2-dimethylbenzene and 40 vol. % cyclohexylbenzene. Drops of a 0.5% w/v solution of the same F8BT polymer as Example 1 were deposited on a surface-modified polyimide substrate by an ink-jet method. Dektak measurements of the profile of the dried drops were taken. The results of the measurements are shown in FIG. 3.

COMPARATIVE EXAMPLE

Drops of a 0.5% w/v solution of the same F8BT polymer as Examples 1 and 2 in 1,2-dimethylbenzene were deposited on a surface-modified polyimide substrate by an ink-jet method. Dektak measurements of the profile of the dried drops were taken. The results of the measurements are shown in FIG. 4.

Figure 3:
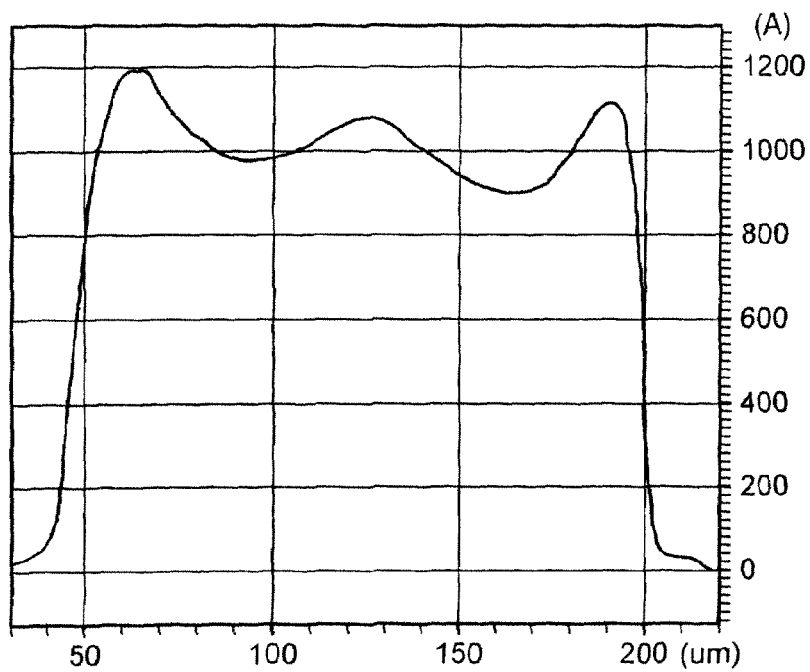
Figure 4:
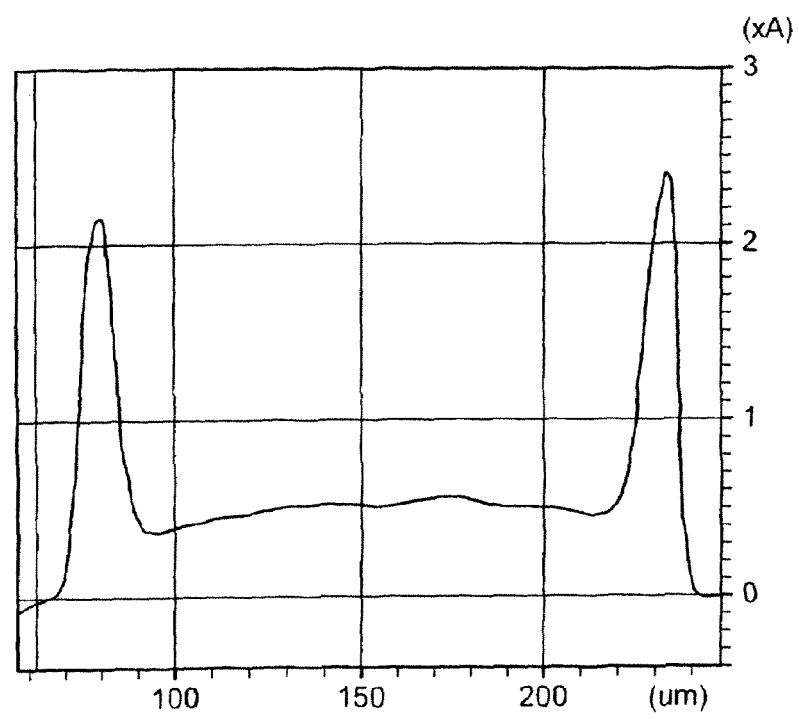
FIG. 4 is a graph showing the thickness profile for a spot of an electroluminescent polymer deposited using a solvent consisting entirely of 1,2-dimethylbenzene.

As can be seen from a comparison of FIGS. 2, 3 and 4, the use of the formulations according to the present invention produced dried drops that were significantly improved in terms of uniformity of thickness compared to the comparative example. It is thought that the improved thickness uniformity is a result of the following mechanism. During drying of the drop, the volatile low boiling point solvent evaporates quickly leaving behind a saturated solution in the high boiling point solvent; this in turn causes the polymer to be precipitated rapidly preventing radial flow within the drop and thus creating a relatively uniform distribution of the polymer in the drop.

Furthermore, the improved uniformity of thickness results in an increased thickness at the centre of the drop for the same concentration of material in the formulation. Being able to control the thickness at the centre of the drop is considered to be an important factor in improving the efficiency of a light-emitting device produced by an ink-jet technique. The present invention thus allows an increase in centre thickness without increasing the concentration in the formulation of the material to be deposited. This can have advantages in producing a device having pixels of the desired size at the desired resolution.

Figure 5:
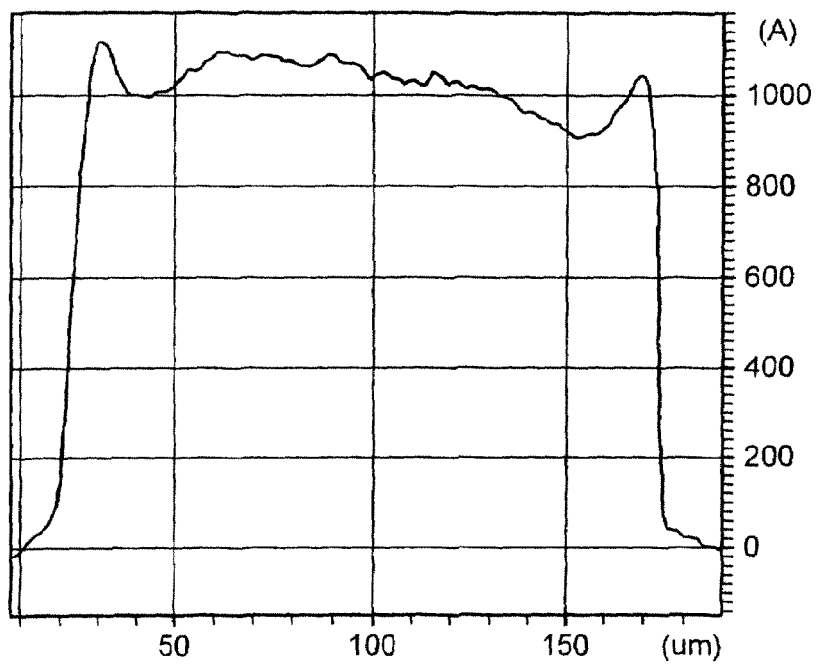
FIG. 5 is a graph showing the thickness profile for a spot obtained by an ink-jet technique using a formulation according to another embodiment of the present invention.
Figure 6A:
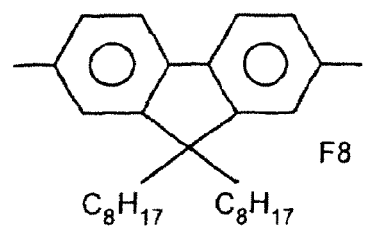
FIGS. 6A-6E illustrate some recurring units and polymers.
Figure 6B:
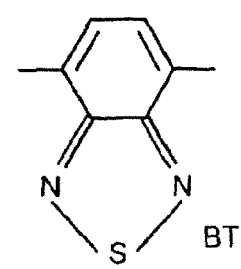
Figure 6C:
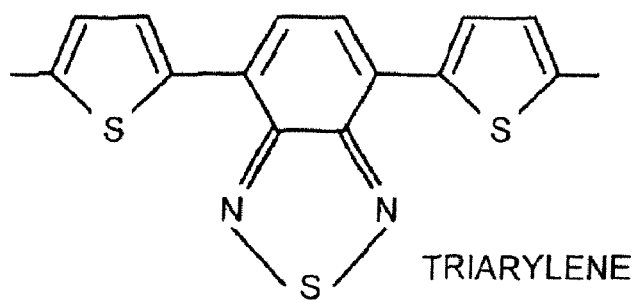
Figure 6D:
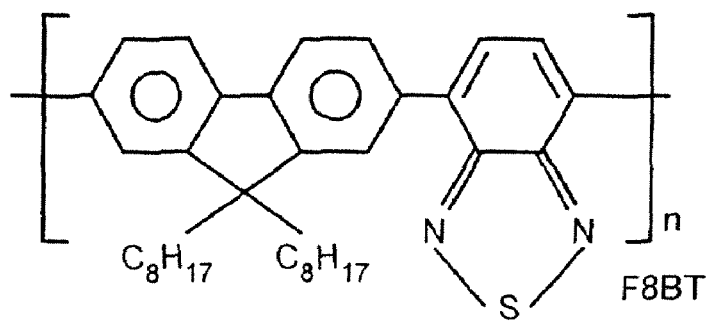
Figure 6E:
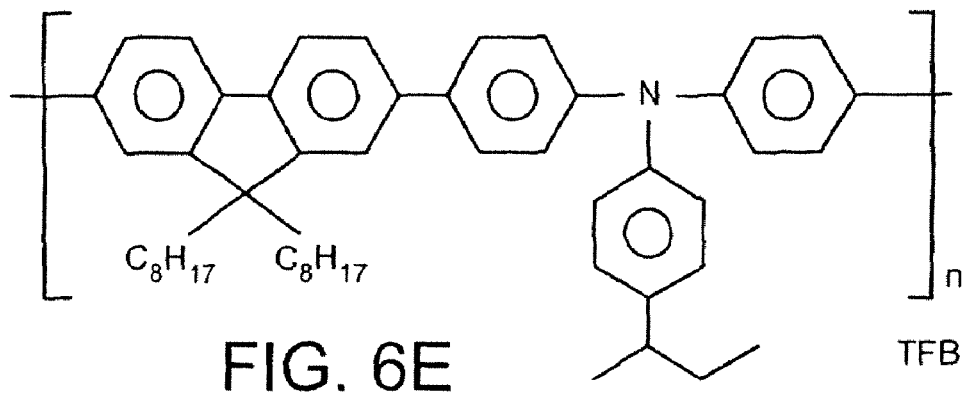

Good results have also been achieved using a solvent blend consisting of 40 vol. % mixed isomers of xylene (b.p.: 138° C.); 40 vol. % 1,2,4-trimethylbenzene (b.p.: 168° C.) and 20 vol. % 3-isopropylbiphenyl (b.p.: 295° C.). FIG. 5 shows a Dektak measurement profile of a dried drop deposited by an ink-jet technique using a 0.5% w/v solution of a polymer blend in this three component solvent system. The polymer blend is relatively highly soluble in the first two, low boiling point solvents relative to the third high boiling point solvent.

What is claimed:

1. A formulation for depositing an electroluminescent material on a substrate according to an ink-jet technique, the formulation comprising the electroluminescent material to be deposited on the substrate dissolved in a solvent system comprising a first solvent component having a relatively high boiling point and which exhibits a relatively low solubility with respect to the material to be deposited, and a second solvent component having a relatively low boiling point and which exhibits a relatively high solubility with respect to the material to be deposited, wherein the difference in boiling point between the first and second solvent components is in the range of 30° C. to 250° C., and the solubility of the material to be deposited in the first solvent component is up to 0.5% weight per volume, and the solubility of the material to be deposited in the second solvent component is greater than 1.5% weight per volume.

2. A formulation according to claim 1 wherein the second solvent component has a boiling point in the range of 100° C. to 200° C.

3. A formulation according to claim 1 wherein the first solvent component has a boiling point in the range of 130° C. to 300° C.

4. A formulation according to claim 1 wherein the difference in boiling point between the first and second solvent components is in the range of 70° C. to 150° C.

5. A formulation according to claim 1 wherein the solubility of the material to be deposited in the first solvent component is in the range of 0.03% to 0.3% weight per volume.

6. A formulation according to claim 1 wherein the amount of material in the formulation and the proportion of the first solvent component are selected such that upon removal of the second solvent component the remaining solution of the material in the first solvent component would be at or above saturation.

7. A method of depositing an electroluminescent material on a substrate comprising depositing one or more drops of a solution of the material onto the substrate through a nozzle according to an ink-jet technique and drying the drops, wherein the solution of the material comprises a formulation according to claim 1.

8. A method according to claim 7 wherein the variation in thickness of the dried drop is less than 30% of the maximum thickness.

9. A method of producing a light-emitting device comprising a layer of an electroluminescent material sandwiched between two electrodes such that charge carriers can move between the electrodes and the layer of electroluminescent material, wherein the layer of electroluminescent material is produced by a method according to claim 7.

* * * * *